United States Patent [19]

Temes et al.

[11] 4,173,723

[45] Nov. 6, 1979

[54] PHOTO DETECTOR INPUT CIRCUIT

[75] Inventors: Gabor C. Temes, Los Angeles; Derek T. Cheung, Thousand Oaks, both of Calif.

[73] Assignee: Rockwell International Corporation, El Segundo, Calif.

[21] Appl. No.: 868,946

[22] Filed: Jan. 12, 1978

[51] Int. Cl.² ............................................. H03K 1/02
[52] U.S. Cl. ............................. 307/304; 250/214 R; 307/221 D; 307/311; 307/DIG. 1
[58] Field of Search ................... 307/221 D, 251, 304, 307/311, DIG. 1, 260; 250/206, 214 R, 214 P

[56] References Cited

U.S. PATENT DOCUMENTS

| 3,770,967 | 11/1973 | Hanna et al. ................. 250/214 R |
| 3,944,849 | 3/1976 | Tasch, Jr. et al. ............. 307/304 X |

*Primary Examiner*—John Zazworsky
*Attorney, Agent, or Firm*—L. Lee Humphries; Craig O. Malin

[57] ABSTRACT

An improved input circuit is provided for an array of photo detectors. For each photo detector in the array, the circuit utilizes a first FET with a source for coupling to an output of a photo detector, a gate coupled to a first gate voltage, and a drain for coupling to an output circuit. The first gate voltage is provided by a feedback circuit which utilizes matched properties of adjacent FETs. In one embodiment, FETs are used in an open loop feedback circuit to reduce the input impedance seen by the photodiode at the source of the first FET. A similar objective is accomplished in another embodiment utilizing FETs in a closed loop feedback circuit. Further embodiments utilize FETs arranged as a differential amplifier with active loads to provide a low input impedance and a virtual ground at the source of the first FET.

4 Claims, 10 Drawing Figures

PHOTO DETECTOR INPUT CIRCUIT

STATEMENT OF GOVERNMENT INTEREST

The Government has rights in the invention pursuant to grant AER 05754 awarded by the National Science Foundation.

BACKGROUND OF THE INVENTION

A. Field of the Invention

This invention relates to the field of electronics, and particularly to solid state electronic circuits for receiving input from an array of photo detectors.

B. Description of the Prior Art

The input circuit associated with a photodiode array has to satisfy several requirements. The ac input impedance of the circuit should be low to assure constant bias voltage for a given diode with varying illumination. The bias voltage of each diode in the array should be independent of the physical properties (threshold voltage, etc.) of the input device in order to assure approximately the same bias voltage for each diode. Additionally, for compact and inexpensive realization, the circuit must be simple and suitable for construction as a metal oxide semiconductor (MOS) integrated circuit.

Prior art input circuits do not accomplish the above requirements. Such prior art circuits utilize a field effect transistor (FET) having a constant gate voltage as a tap gate for each of the photodiodes. A shortcoming of such prior art circuit is that the photodiode's anode potential is determined, for small diode currents, by the threshold voltage of the tap gate FET. Since the threshold voltage can vary appreciably (by as much as 50 mV) along the focal plane, the photodiode bias changes from individual photodiode to individual photodiode. Such change in bias causes a significant amount of fixed-pattern noise in the system.

SUMMARY OF THE INVENTION

It is an object of the invention to provide an improved input circuit for photodetectors used in an array.

It is an object of the invention to provide an input circuit having a low ac input impedance for diodes in a photodiode array.

It is an object of the invention to provide an input circuit which assures that each photodiode in a photodiode array has a nearly constant bias voltage during varying illumination of the photodiodes.

It is an object of the invention to provide an input circuit that assures approximately the same bias voltage for each photodiode in an array of photodiodes.

It is an object of the invention to provide an input circuit which provides a bias voltage to the photodiodes in an array of photodiodes which bias voltage is substantially independent of the physical properties, such as threshold voltage, of the elements of the input circuit.

It is an object of the invention to provide a compact, inexpensive, integrated input circuit for an array of photodiodes.

According to the invention, an improved circuit is provided for an array of photo detectors. For each photo detector in the array, the circuit utilizes a first FET with a source for coupling to an output of a photo detector, a gate coupled to a first gate voltage, and a drain for coupling to an output circuit. The first gate voltage is provided by a feedback circuit which utilizes matched properties of adjacent FETs. In one embodiment, FETs are used in an open loop feeback circuit to reduce the input impedance seen by the photodiode at the source of the first FET. A similar object is accomplished in another embodiment utilizing FETs in a closed loop feedback circuit. Further embodiments utilize FETs arranged as a differential amplifier with active loads to provide a low input impedance and a virtual ground at the source of the first FET.

These and other objects and features of the present invention will be apparent from the following detailed description, taken with reference to the accompanying drawings.

DESCRIPTION OF THE PREFERRED EMBODIMENT

Figure 1:
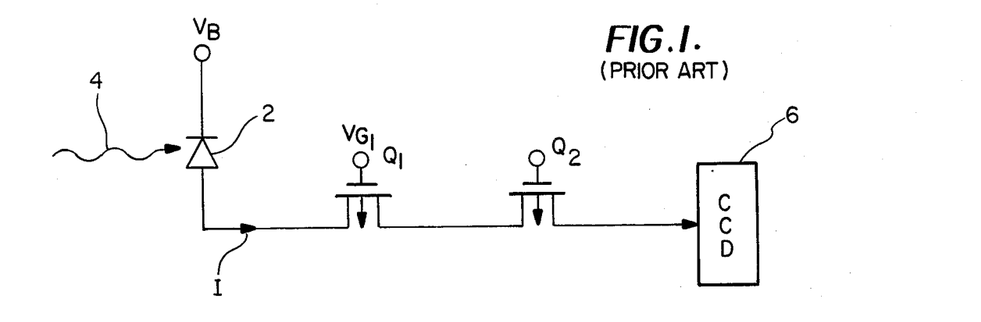
FIG. 1 is a diagram of an input circuit for a single photodiode according to the prior art.

FIG. 1 shows a prior art input circuit for each photodiode detector 2 in an array of detectors. The input circuit is a FET forming tap gate $Q_1$ with a gate voltage, $V_{G1}$, and a drain coupled to a second FET forming transfer gate $Q_2$. The output of photodiode 2 is coupled to the source of tap gate $Q_1$ and provides a signal to $Q_1$ depending upon the radiation 4 striking photodiode 2. The drain of $Q_2$ is fed into signal processing circuitry such as charge couple device (CCD) 6 which may act as a time delay integration register (TDI), or multiplexer.

Figure 2:
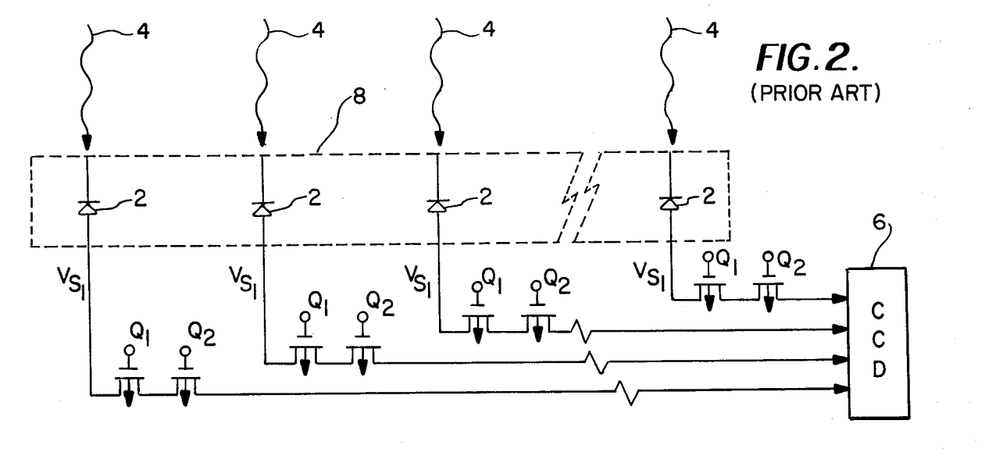
FIG. 2 shows the input circuit of FIG. 1 as applied to an array of photodiodes according to the prior art.

FIG. 2 shows the input circuit of FIG. 1 applied to an array 8 of individual photodiodes 2. FETs form tap gates $Q_1$ of each circuit and transfer gates $Q_2$ of each circuit which feed signals into charge couple device 6. Radiation 2 strikes the photodiodes with an intensity which may vary at each photodiode depending upon the image being observed. This result in signals being created at each photodiode, the strength of each signal being related to the image being observed. However, a shortcoming of such prior art input circuit is that the anode potential, $V_{s1}$, of each diode 2 is determined, for small diode currents, by the threshold voltage, $V_T$, of its corresponding FET forming the tap gate $Q_1$. Since the threshold voltage of each FET can vary appreciably (by as much as 50 mV), the diode bias changes from detector to detector causing a significant amount of fixed-pattern noise in the system.

Figure 3:
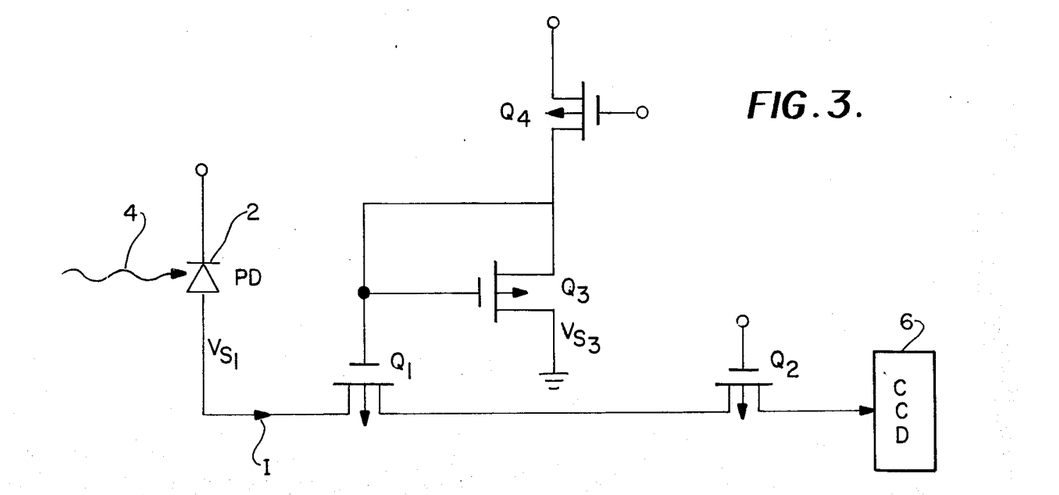
FIG. 3 is a diagram of an input circuit of the invention utilizing open loop feedback to provide compensation for variations in the threshold voltage of the tap gate FET.

FIG. 3 shows an embodiment of the invention which substantially overcomes this problem by utilizing the matched properties of adjacent FETs in an open loop feedback circuit. FETs forming stages $Q_1$ and $Q_3$ both operate in saturation and are located adjacently, sharing the same gate oxidation and metallization. Hence, the gate voltage, $V_G$, and the threshold voltage, $V_T$, are very nearly the same for these two FETs.

The dimensions and bias voltages of stage $Q_4$ are chosen so that the current of the drains of $Q_3$ and $Q_4$ are equal and approximately the same as the current of the source of $Q_1$ ($I_{D3}=I_{D4}\simeq I$), and the voltage of the gate of $Q_3$ equals the voltage of the drain of $Q_3$ and the threshold voltage of $Q_3$ ($V_{G3}=V_{D3}=V_{T3}$). For stable operations, it is expedient to make the geometrical width to length ratio of the gate metallization of $Q_4$, $(Z/L)_4$, much smaller than the same ratio for $Q_3$, $(Z/L)_3$, i.e. $(Z/L)_4 << (Z/L)_3$.

Since $Q_1$ and $Q_3$ are both in saturation, and since $V_{G1}=V_{G3}$, $V_{T1}\simeq V_{T3}$, and $I_{D1}=I\simeq I_{D3}$, it follows that $V_{S1}\simeq V_{S3}=0$. Thus, $V_{G1}$ is set by $Q_3$ and $Q_4$ to such a value that it creates a virtual ground at the source of $Q_1$.

A detailed analysis of the circuit shows that it will operate in the same manner if the condition $I_{D3}\simeq I$ is replaced by $(L/Z)_3 I_{D3} \simeq (L/Z)_1 I$. The deviation of $V_{S1}$ from zero is given by:

$$V_{S1} \simeq (V_{T3} - V_{T1}) + \left[\frac{2}{\mu C_o}(L/Z)_1 I\right]^{\frac{1}{2}} \frac{\Delta I/I}{2} . \qquad \text{Eqn. (1)}$$

In Equation (1), $\Delta I = I_{D3} - I$ and hence $\Delta I/I$ is the relative error in $I_{D3}$ and $I_{D4}$.

Since $Q_1$ and $Q_3$ are adjacent devices sharing the same gate, a difference in threshold voltage between them of less than 2 mV can be achieved, i.e. $|V_{T3}-V_{T1}|<2$ mV. Also, for typical photodiode currents and choosing a high-transconductance geometry for $Q_1$, the factor of $(\Delta I/I)$ is of the order of 10 mV. Hence, if the accuracy of the drain currents of $Q_3$ and $Q_4$ is $\pm 20\%$, then the second term on the right hand side of Eqn. (1) is about $\leq 2$ mV. Thus, $V_{S1} \leq 4$ mV is obtainable with the circuit shown in FIG. 3.

This derivation leading to Eqn. (1) is based on the simple square-law formula for the saturation currents of FETs forming $Q_1$, $Q_3$, $Q_4$, and ignores the effects of drain voltages, backgate potentials, etc. Even so, an order of magnitude improvement in the variations of $V_{S1}$ for each circuit in the array can be obtained when using the circuit of FIG. 3 rather than the prior art circuit of FIG. 1.

Figure 4:
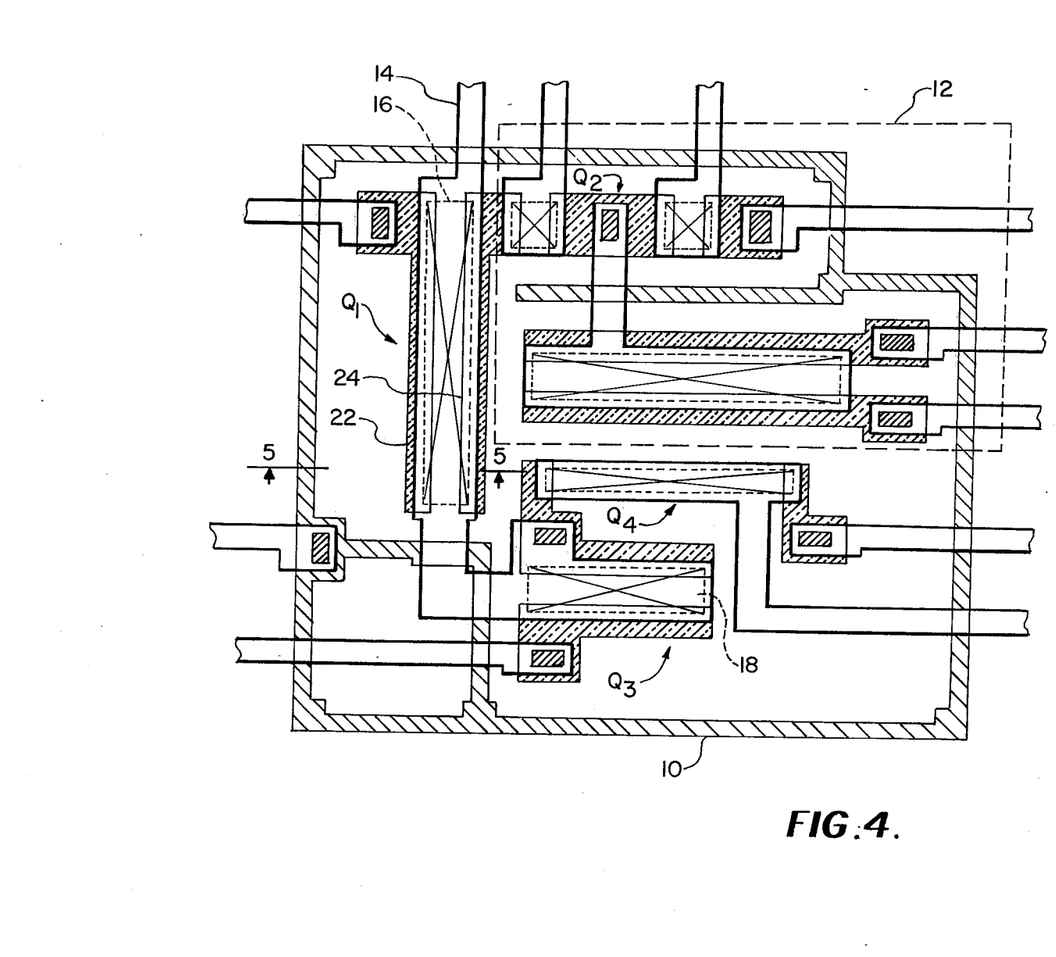
FIG. 4 is an integrated circuit layout of the embodiment shown in FIG. 3.

FIG. 4 shows an integrated circuit layout on a silicon chip for the embodiment shown in FIG. 3. The circuit is isolated on the chip by $n^+$ doped boundary 10. The area within broken lines 12 is output circuitry including stage $Q_2$. As shown, stages $Q_1$ and $Q_3$ are metal oxide silicon FETs (MOSFETs). They are adjacent FETs sharing the same gate metallization 14 and having similarly prepared gate oxidation (insulation) 16, 18. Thus, it is possible to obtain threshold voltages in theses two MOSFETs which are within 2 mV of each other as previously discussed.

Figure 5:
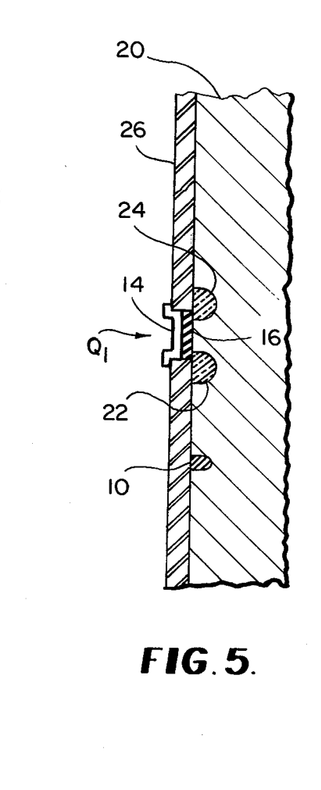
FIG. 5 is a partial cross section at 5—5 in FIG. 4.

FIG. 5 is a cross section of the MOSFET forming $Q_1$ at line 5—5 of FIG. 4. A boundary 10 of $n^+$-type silicon is formed in a chip 20 of p-type silicon. Islands of n-type silicon are formed in chip 20 to make the source 22 and drain 24 of $Q_1$. Silicon oxide insulation layer 26 covers chip 20 except at the gate between source 22 and drain 24. Gate oxide 16 is covered with gate metallization 14 to form the typical MOSFET structure. As mentioned above, gate oxide 16, 18 and gate metallization 14 are shared (or continuous or matched) for both $Q_1$ and $Q_3$ in the circuit of FIGS. 3 and 4 so that matching properties are obtained in both these MOSFETS.

Figure 6:
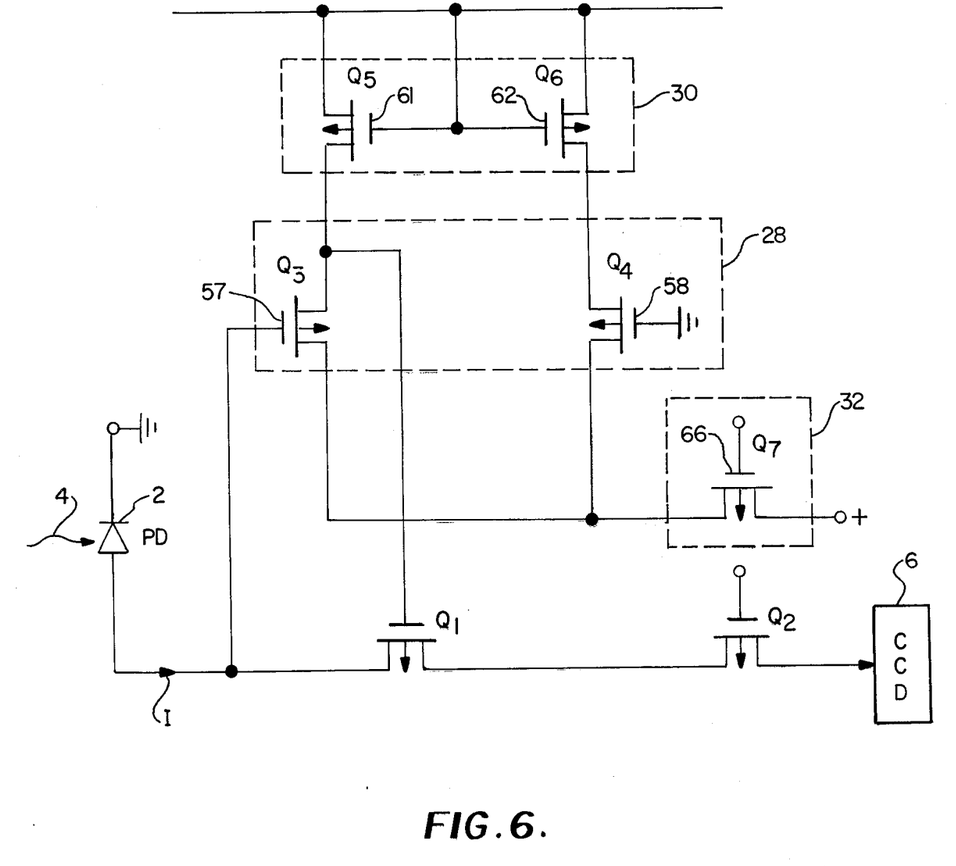
FIG. 6 is a diagram of an input circuit of the invention utilizing a differential amplifier circuit with matched loads.

FIG. 6 shows a second embodiment of the invention utilizing matched FETs to form a differential amplifier 28 and matched FETs to provide matched loads 30 for the differential amplifier. $Q_7$ is a current source 32. Since $Q_3$ and $Q_4$ as well as $Q_5$ and $Q_6$ are matched, when $V_{S1}=0$, $I_{D3}\simeq I_{D4}\simeq I_{D7}/2$. If $V_{S1}$ deviates from zero, the error will be amplified and fed back inverted to the gate of $Q_1$. This circuit does not rely on the value of the diode current I and hence is more independent of diode characteristics and illumination than the circuits shown in FIGS. 1 and 3.

Figure 7:
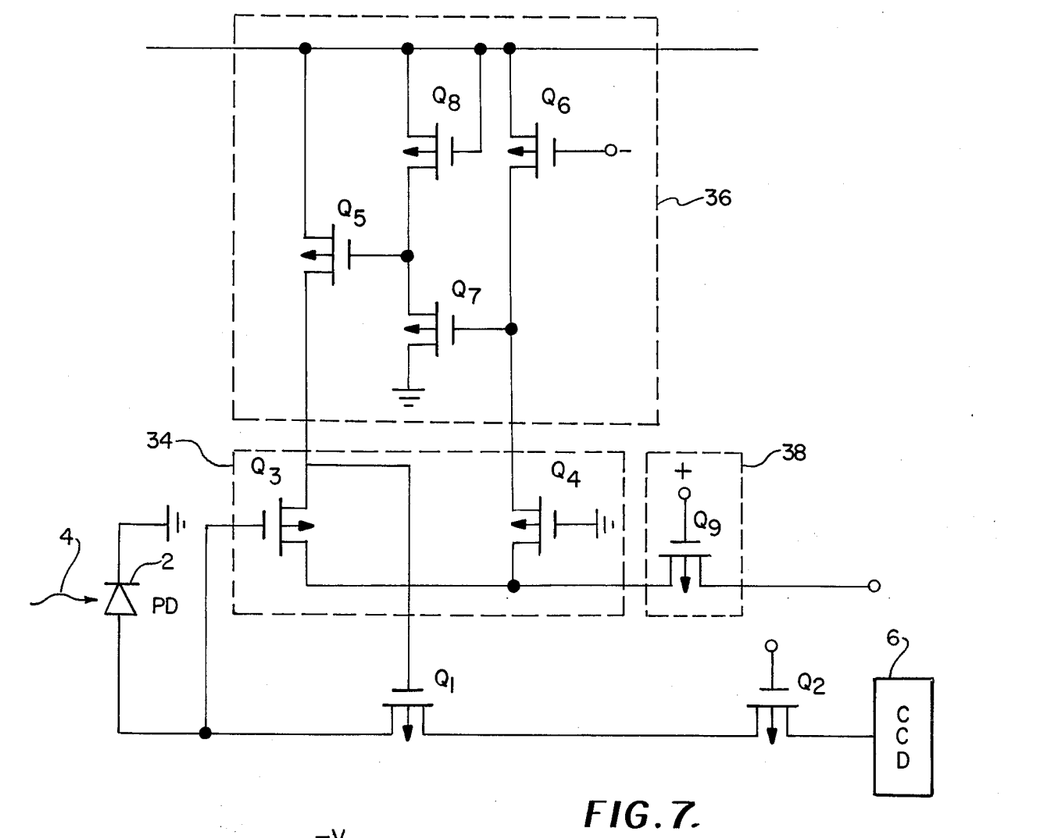
FIG. 7 is a diagram of an input circuit of the invention utilizing a differential amplifier circuit with active loads.

At the cost of upsetting somewhat the symmetry of the amplifier, the loop gain can be increased by changing the connection of the active loads, as shown in the third embodiment, FIG. 7. In this embodiment, matched FETs form differential amplifier 34, Stages $Q_5$–$Q_8$ provide active loads 36 for differential amplifier 34, and $Q_9$ is the current source 38.

Figure 8:
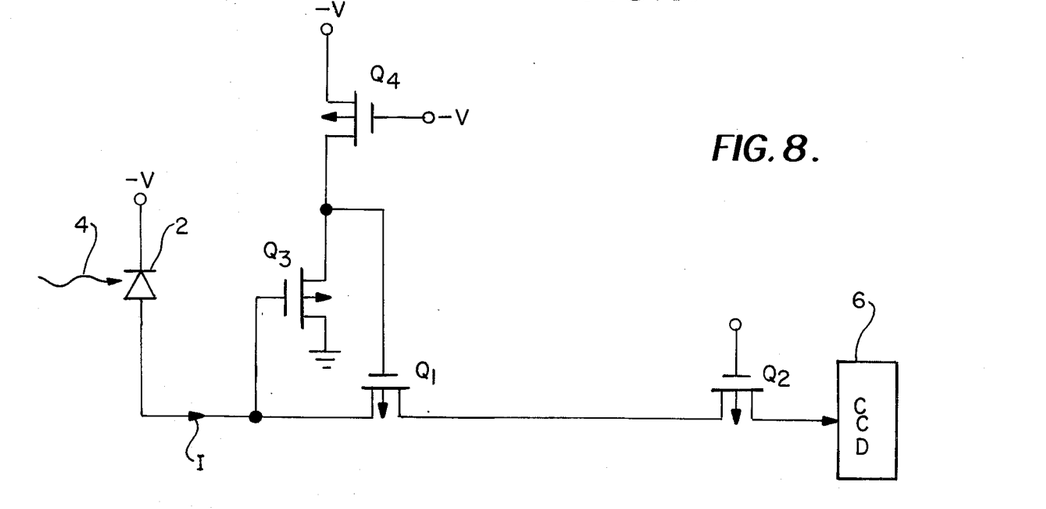
FIG. 8 is a diagram of an input circuit of the invention utilizing a closed loop feedback circuit.

A third embodiment of the invention utilizing a simple closed loop feedback circuit is shown in FIG. 8. This embodiment reduces somewhat the dependence of the source voltage of $Q_1$, $V_{S1}$, on $Q_1$'s threshold voltage, $V_{T1}$, and also reduces the input impedance seen by photodiode 2. An analysis based on the simple square-law formula for the MOSFETs forming stages $Q_1$–$Q_4$ gives the following relationships:

$$V_{S1}=[V_{G4}-(V_{T1}+V_{T4}-V_{T3}r)+\delta V]/(1+r) \qquad \text{Eqn. (2)}$$

where:

$$r=\sqrt{(Z/L)_3/(Z/L)_4},$$

and $$\delta V=\sqrt{I/\{(Z/L)_1(\mu C_o/2)\}}.$$

As mentioned earlier, $\delta V \sim 20$ mV and is negligible. If the FETs forming $Q_1$, $Q_3$, and $Q_4$ are adjacent and matched, then it can be assumed that $V_{T1}\simeq V_{T4}\simeq V_{T3}$ and choosing $(Z/L)_3=4(Z/L)_4$, equation (2) becomes:

$$V_{S1}=V_{G4}/3 \qquad \text{Eqn. (3)}$$

and the voltage of the source of $Q_1$, $V_{S1}$, is essentially independent of the threshold voltage $V_{T1}$ of the FET forming $Q_1$. Further, the sensitivity of $V_{S1}$ to variations of I is reduced by a factor $(1+r)$, and hence so is the input impedance of the circuit.

Figure 9:
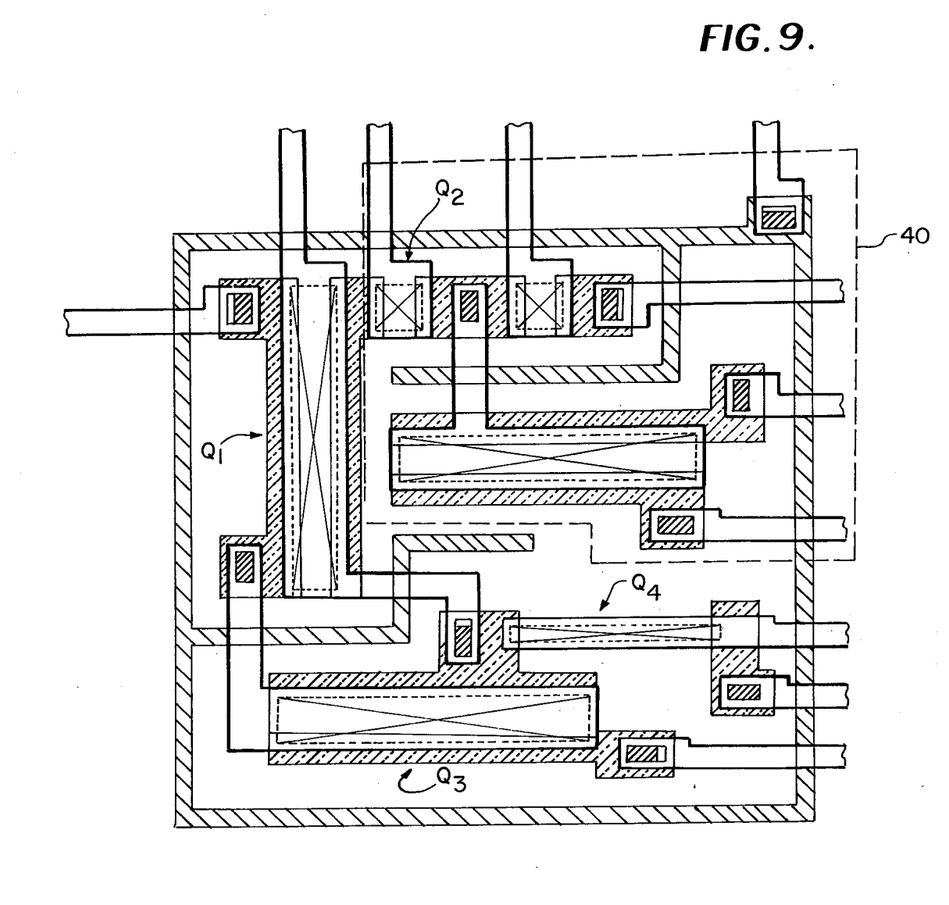
FIG. 9 is an integrated circuit layout of the embodiment shown in FIG. 8.

FIG. 9 shows an integrated circuit layout of a silicon chip for the circuit shown in FIG. 8. The MOSFETs forming stages $Q_1$, $Q_3$, and $Q_4$ are located adjacent each other and share metallization and n-type doping to the extent possible in order to obtain matched properties. The cross-sections of the MOSFETs of FIG. 9 are similar to that shown in FIG. 5. The broken lines 40 enclose the output circuit containing $Q_2$.

The circuits shown in FIGS. 3 and 8 were fabricated on silicon according to the layouts in FIGS. 4 and 9 using standard p-channel MOS technology. The reduction in input impedance and in the spread in values of input bias voltage were verified experimentally.

Figure 10:
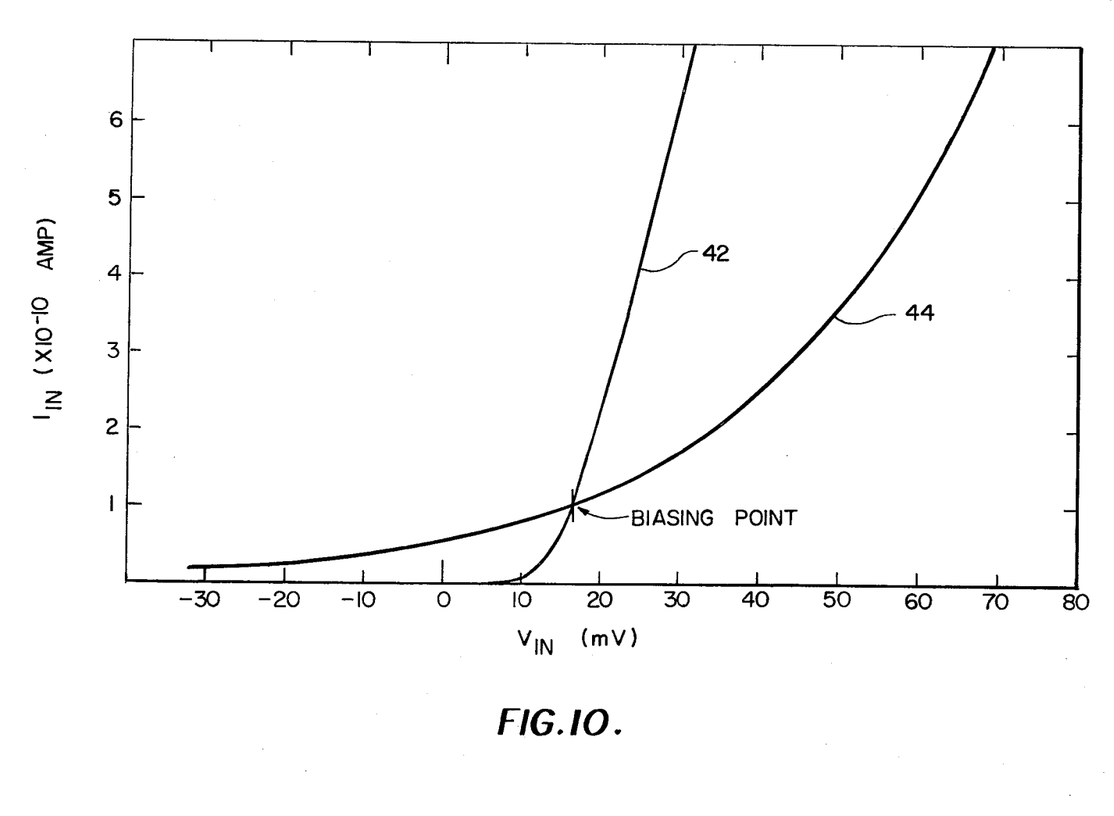
FIG. 10 shows curves comparing the input impedance of a prior art circuit with the imput impedance of the circuit shown in FIGS. 8 and 9.

The circuit shown in FIGS. 8 and 9 were evaluated utilizing a substrate (ground) voltage of 0.7 V and a voltage of −5 V for the gate and source of $Q_4$. The drain of $Q_1$ was connected to −6 V through a 500 KΩ resistor. The current-voltage characteristic at the source of $Q_1$ of this feedback circuit is shown in curve 42 of FIG. 10. For comparison, the current-voltage characteristic of a comparable prior art circuit without feedback (FIG. 1) is shown in curve 44. A reduction in input impedance by a factor of approximately 5 is achieved.

In another test, a 7×8 array of photodiodes (56 individual diodes) was connected to a plurality of conventional input circuits such as shown in FIGS. 1 and 2. The voltage of the gate of $Q_1$ was held constant at −0.59 V. The input voltage at $Q_1$ was measured for each tap gate when the radiation 4 was sufficient to create an input current, I, of 1 μA at the corresponding photodiode. The results in mVs for this prior art arrangement are shown below: (The x's indicate defective circuits on the chip.)

| 11 | 41 | x | 35 | x | 6 | 0 | −110 |
|---|---|---|---|---|---|---|---|
| x | −23 | x | −57 | −40 | −86 | x | −60 |
| 10 | −14 | −41 | −7 | x | −50 | −64 | −10 |
| −37 | 15 | 2 | −45 | −140 | −76 | x | −110 |
| 26 | −25 | −120 | −180 | −150 | −22 | −30 | −40 |
| 5 | 0 | −75 | −100 | −100 | −2 | −65 | −65 |
| −72 | 10 | −10 | −40 | x | −160 | −5 | 12 |

A similar test was run on the same array of photodiodes utilizing the threshold compensation circuit shown in FIGS. 3 and 4. The voltage of the drain of $Q_4$ was held at approximately −3.5 V to give a current of 0.5 μA for $Q_3$ and $Q_4$. The results in mVs for this embodiment of the invention are shown below:

| −4 | 4 | x | 2 | x | 2 | 0 | −56 |
|---|---|---|---|---|---|---|---|
| x | −8 | x | −26 | −12 | −18 | x | −4 |
| −6 | −4 | −13 | −19 | x | −12 | x | 5 |
| −9 | 0 | 0 | −25 | −44 | −33 | −48 | −35 |
| −19 | −16 | −40 | −68 | −50 | −5 | −16 | −18 |
| −4 | −1 | −28 | −32 | −25 | −4 | −19 | −22 |
| 0 | −10 | −16 | x | −47 | −18 | 4 | 12 |

The maximum range in the value of input voltages for the prior art arrangement is 221 mV, whereas the maximum range obtained utilizing the present invention was only 80 mV.

Thus, by utilizing the matched properties of adjacent FETs and a feedback circuit to provide the gate voltage for the tap gate of a photodiode, a circuit is provided which has a low input impedance and a low spread in input bias voltage for all the photodiodes in an array of photodiodes.

Numerous variations and modifications may be made without departing from the present invention. For example, the circuits can be designed using n-channel MOSFETs as described, p-channel MOSFETs or complementary MOSFETs including both n-channel and p-channel transistors. Accordingly, it should be clearly understood that the form of the present invention described above and shown in the accompanying drawings is illustrative only and is not intended to limit the scope of the present invention.

What is claimed is:

1. A photo detector input circuit comprising:
   a first FET with a source for coupling to an output of a photo detector, a gate coupled to a first gate voltage, and a drain for coupling to an output circuit;
   a second FET with a grounded source and a gate coupled to said gate of said first FET, said second FET being positioned adjacent said first FET so that the gate voltages and threshold voltages of said first and second FETs are substantially equal;
   a third FET with a source coupled to the drain of said second FET, a gate coupled to a third gate voltage, and a drain coupled to a third drain voltage; and
   wherein said gates of said first and second FETs are coupled to said drain of said second FET, and said third gate voltage and said third drain voltage are chosen so that the currents of the drains of said second and third FETs are equal and approximately the same as the output current of the photo detector, whereby a low impedance and virtual ground are provided at said source of said first FET, and the voltage variation of said first FET is reduced.

2. A photo detector input circuit comprising:
   a first FET with a source for coupling to an output of a photo detector, a gate coupled to a first gate voltage, and a drain for coupling to an output circuit;
   a second FET;
   a third FET, said second and third FETs being a matched pair of adjacent FETs acting as a differential amplifier, the gate of said second FET being coupled to the source of said first FET and the gate of said third FET being grounded, and the drain of said second FET being coupled to the gate of said first FET in a negative feedback loop;
   a fourth FET;
   a fifth FET, said fourth and fifth FETs providing a matched load to said second and third FETs, the gates of said fourth and fifth FETs being coupled to each other and to a voltage which is common to the drains of said fourth and fifth FETs; and
   a sixth FET having a gate and source voltage which is positive with respect to ground, the drain of said sixth FET providing the current source for said second and third FETs, whereby a low impedance and a virtual ground are provided at said source of said first FET.

3. A photo detector input circuit comprising:
   a first FET with a source for coupling to an output of a photo detector, a gate coupled to a first gate voltage, and a drain for coupling to an output circuit;
   a second FET;
   a third FET, said second and third FETs being a matched pair of FETs acting as a differential amplifier, the gate of said second FET being coupled to the source of said first FET and the gate of said third FET being grounded, and the drain of said second FET being coupled to the gate of said first FET;
   a fourth FET;
   a fifth FET, said fourth and fifth FETs providing a matched load to said third and fourth FETs;
   a sixth FET having a gate and source voltage which is positive with respect to ground, the drain of said sixth FET providing the current source for said second and third FETs;

a seventh FET having a drain coupled to the gate of said fourth FET, a gate coupled to the drain of said third FET, and a grounded source; and an eighth FET having a gate and drain coupled to a common voltage with the drains of said fourth and fifth FETs, and a source coupled to the gate of said fourth FET, whereby a low impedance and virtual ground are provided at said source of said first FET.

4. A photo detector input circuit comprising:

a first FET with a source for coupling to an output of a photo detector, a gate coupled to a first gate voltage, and a drain for coupling to an output circuit;

a second FET adjacent to said first FET and matched to said first FET, said second FET having a gate coupled to the source of said first FET and having a grounded source, said first and second FETs, forming a closed loop feedback circuit to cancel the threshold voltage of said first FET; and a third FET having a source coupled to the gate of said first FET and to the drain of said second FET and having a drain and a gate coupled to a voltage which is negative with respect to said grounded source, whereby the photo detector input circuit has a low input impedance.

* * * * *